United States Patent
Knoop et al.

(10) Patent No.: US 8,564,300 B2
(45) Date of Patent: Oct. 22, 2013

(54) METHOD AND APPARATUS FOR TESTING AIRCRAFT ELECTRICAL SYSTEMS

(75) Inventors: Sven Knoop, Hamburg (DE); Mike Galinski, Hamburg (DE)

(73) Assignee: Airbus Operations GmbH (DE)

( * ) Notice: Subject to any disclaimer, the term of this patent is extended or adjusted under 35 U.S.C. 154(b) by 564 days.

(21) Appl. No.: 12/744,955

(22) PCT Filed: Nov. 29, 2007

(86) PCT No.: PCT/EP2007/010375
§ 371 (c)(1),
(2), (4) Date: Nov. 18, 2010

(87) PCT Pub. No.: WO2009/068061
PCT Pub. Date: Jun. 4, 2009

(65) Prior Publication Data
US 2011/0050244 A1    Mar. 3, 2011

(51) Int. Cl.
*G01R 31/00*    (2006.01)
(52) U.S. Cl.
USPC .......................... 324/503; 324/73.1; 324/556
(58) Field of Classification Search
None
See application file for complete search history.

(56) References Cited

U.S. PATENT DOCUMENTS

| | | | |
|---|---|---|---|
| 4,389,710 A | 6/1983 | Rasmussen | |
| 4,472,677 A | 9/1984 | Rowe | |
| 4,870,347 A * | 9/1989 | Cicerone | 324/114 |
| 4,930,362 A * | 6/1990 | Griffin | 73/865.3 |
| 5,617,039 A | 4/1997 | Kuck et al. | |
| 6,972,554 B1 | 12/2005 | Davis | |
| 7,002,336 B2 * | 2/2006 | Leonard et al. | 324/764.01 |
| 2005/0081733 A1 * | 4/2005 | Leonard et al. | 102/288 |

OTHER PUBLICATIONS

International Search Report for Appln. No. PCT/EP2007/010375 dated Aug. 26, 2008.

* cited by examiner

*Primary Examiner* — Minh N Tang
(74) *Attorney, Agent, or Firm* — Carter DeLuca Farrell & Schmidt LLP

(57) ABSTRACT

A method, and corresponding apparatus, for testing an aircraft control system is disclosed. The method includes simultaneously coupling a test device to a plurality of separate test points in an aircraft control system, selecting each test point individually such that the test device is enabled for electrical connection with the selected test point, conducting a test on the control system at each selected test point using the test device, detecting a signal or voltage at the selected test point, and indicating a result of the test at the selected test point to an operator.

5 Claims, 3 Drawing Sheets

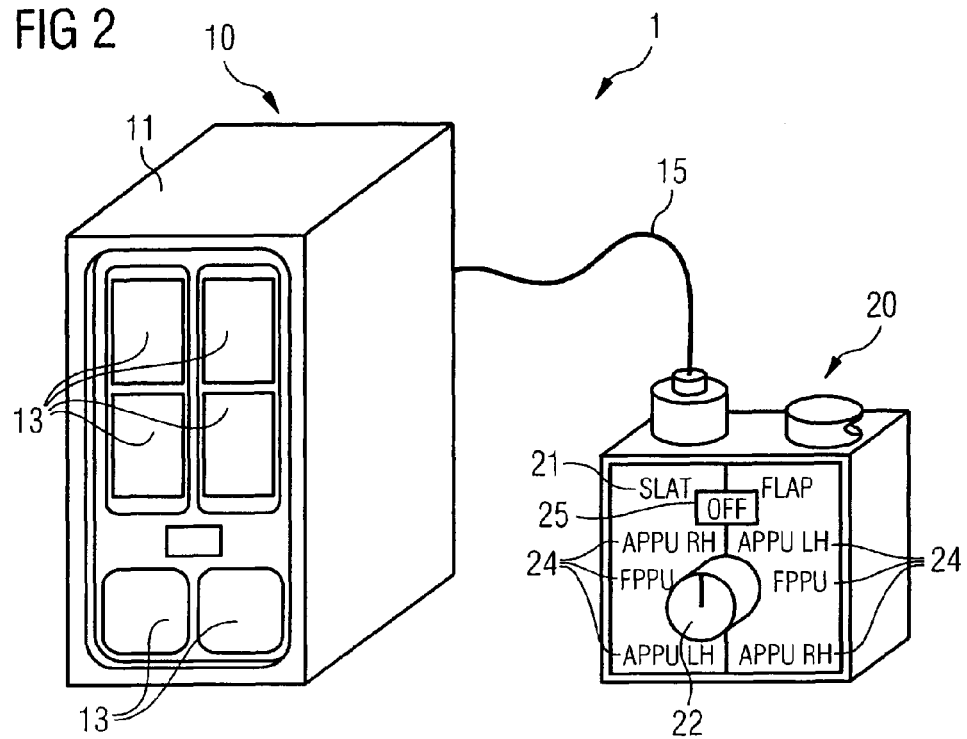
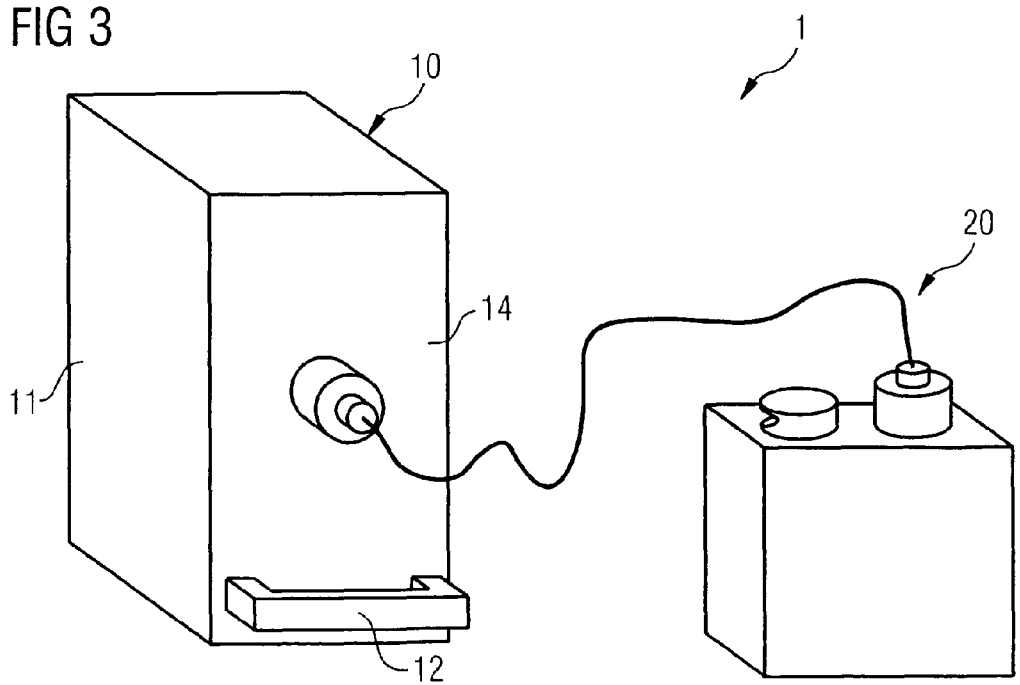

METHOD AND APPARATUS FOR TESTING AIRCRAFT ELECTRICAL SYSTEMS

FIELD OF THE INVENTION

The present invention relates to a testing method and apparatus, and more particularly, to a method and apparatus for testing the operability of one or more electrical system in an aircraft.

BACKGROUND OF THE INVENTION

Modern aircraft, and particularly larger commercial aircraft, are highly sophisticated vehicles incorporating numerous electrical systems for ensuring vehicle control and safety. During the assembly and commissioning of a new aircraft, it is necessary to ensure that the multitude of electrical circuits in the various control and safety systems of the aircraft are connected and operating correctly.

The testing and evaluation of the various control and safety systems during the assembly of an aircraft conventionally involve conducting a particular test procedure at a number of different test points. In other words, essentially the same procedure must be repeatedly carried out time and again at each of the series of test points. This may, for example, involve the testing of a particular avionic unit at multiple connection or input points to determine whether or not a defined voltage exists at each input. A significant drawback of such a testing regime is that the execution of the tests is extremely time intensive, and therefore cost intensive, because it involves manually checking each of the various test points one after the other. This requires that test equipment be positioned at different locations and that a new contact or connection be established at each of the different test points. Furthermore, with a large number of separate test points, the risk that one or more test point may be overlooked also becomes significant in such a conventional testing regime.

Thus, it is an object of the present invention to provide a method and apparatus for testing aircraft control and safety systems which are simpler to implement and are optimized from a time and cost perspective. It is a further object of the invention to provide such a method and apparatus that may reduce the risk of a test point being overlooked or missed.

SUMMARY OF THE INVENTION

According to one aspect, the present invention provides a method of testing an aircraft electrical system, comprising the steps of:
 simultaneously coupling a test device to a plurality of separate test points in an aircraft electrical system;
 individually selecting any one of the plurality of test points, such that the test device is enabled for electrical connection with the selected one of the plurality of test points; and
 conducting a test on the electrical system at that one of the plurality of test points selected with the selector means using the test device.

The above expression "enabled for electrical connection" is to be understood as meaning that the potential for electrical current flow exists, although it may be that a certain threshold voltage would be necessary across the connection before any current would be able to flow.

The method of the invention typically comprises the step of individually selecting each of the plurality of test points of the electrical system, one after the other, such that all of the test points of the electrical system are tested in series. The number of test points is preferably at least three, more preferably in the range of four to ten, and may even be as many as twenty or more.

In a preferred form of the invention, the method includes the step of consolidating the test points of the electrical system into a group and arranging the test points in that group to be simultaneously coupled to the test device. In a preferred form of the invention, the coupling step of the method comprises simultaneously coupling a plurality of connector elements of the test device to the plurality of separate test points in the aircraft electrical system Thus, the present invention provides a new testing regime that significantly improves upon the conventional method. In particular, a significant advantage of the present invention is the enormous saving in time and effort which is realized by the user not having to move his/her testing equipment to different test points at different locations around the aircraft and then establish a new connection at each of the various test-points. The invention thus enables the testing to occur much more efficiently by simultaneously coupling the test apparatus to an entire group of test points of the electrical system at a single location and then individually selecting and testing each point of the system, one after the other.

In a preferred form of the invention, the step of conducting a test on the electrical system includes detecting one or more signal at the test point of the electrical system selected with the selector means. For example, the detecting step may include detecting whether or not a defined voltage exists at the selected test point.

In a preferred form of the invention, the method further comprises the step of: indicating a result of the test at the selected test point to an operator. For example, the indicating step may include providing a visual indication of the test result, and preferably comprises illuminating and/or not-illuminating a lamp or a light-emitting diode (LED) to indicate the state of the electrical system at the selected test point.

In a preferred form of the invention, the method further comprises the step of: measuring a property of a signal detected at the selected test point of the electrical system. In addition, the method may further comprise the step of: generating one or more test signal as an input to the selected one of the test points of the electrical system.

According to another aspect, the present invention provides an apparatus for implementing the method of the invention described above. Indeed, the nature of the inventive method will become clearer from the following description of the apparatus. In particular, the invention provides an apparatus for testing an aircraft electrical system, comprising:
 connector means for simultaneously coupling the apparatus to a plurality of separate test points in an aircraft electrical system; and
 selector means adapted to individually select any one of the plurality of test points, such that the apparatus is enabled for electrical connection with the selected one of the plurality of test points;
 wherein the apparatus is adapted to test the electrical system at any one of the plurality of test points selected with the selector means.

In a preferred form of the invention, the connector means comprises a plurality of connector elements for simultaneously coupling the test apparatus to the plurality of separate test points in the aircraft electrical system. In particular, the test points may be arranged in discrete groups, with each group having its own connector element. Each group of test points may, for example, correspond to a particular function or operation of the aircraft electrical system. In one form of the invention, the plurality of separate test points may correspond to a plurality of signal input points for the aircraft electrical system. For example, the electrical system may be an aircraft control system comprising a processor having multiple input points for control signals, e.g. sensor signals or feedback signals, which provide the processor with information on the state of the aircraft. In that case, therefore, the connector means may comprise a plurality of connector elements for simultaneously coupling the apparatus to all of the input points of the processor in the aircraft electrical system. The apparatus may thus determine whether the input points of the control system are in the proper condition for receiving signals.

In another form of the invention, the plurality of separate test points may correspond to a plurality of separate circuits of the electrical system. Accordingly, the connector means comprises a plurality of connector elements for simultaneously coupling the test apparatus to the plurality of separate circuits of the system such that the test apparatus may determine whether the circuits are connected and operating correctly.

In a preferred form of the invention, the selector means comprises a switching device for selectively switching the test apparatus into electrical connection with any one of the plurality of test points. Preferably, the switching device is designed to be manually operated by the user, although remote-controlled operation is also contemplated by this invention. The switching device may include a rotatable dial and/or a push-button type switching arrangement.

In a preferred form of the invention, the test apparatus comprises detector means for detecting one or more signal at the test point of the electrical system selected with the selector means. For example, the detector means may be designed to detect whether or not a defined voltage exists at the system test point selected with the selector means. In this way, the detector means of the apparatus may conduct the test on the electrical system at the selected test point.

The detector means of the test apparatus preferably includes indicator means for indicating the result of the test at the selected test point to a user operating the apparatus. The indicator means is typically adapted to provide a visual indication of the test result, and may for example comprise a lamp or light-emitting diode (LED), the illumination or non-illumination of which indicates a particular state of the electrical system at the selected test point. Alternatively, or additionally, the indicator means may provide an audible indication of the test result.

In a particularly preferred form, the detector means may also be adapted to measure a signal detected at the selected test point of the electrical system. In this regard, the detector means may comprise a meter for measuring, for example, a voltage detected at the selected test point.

In a preferred form of the invention, the test apparatus may further comprise signal means for generating one or more test signal as an input to the selected one of the test points of the electrical system. For example, the signal means may be adapted to generate a single test signal for input at each of the selected test points. Alternatively, the signal means may be adapted to generate a plurality of different test signals for input at the selected test points. Accordingly, the selector means may be adapted to select one of the plurality of test signals and to input the selected test signal to the selected test point of the electrical system.

As noted above for the method, the apparatus of the invention provides major savings in time and effort during the testing of aircraft electrical systems because there is no need for the user to move his/her testing equipment to access different test points at different locations around the aircraft. Furthermore, there is no need to manually establish a new connection with each of the various test-points in order to carry out each individual test. The testing is therefore much more efficient in terms of both time and cost, and the risk of missing or overlooking a particular test point is also significantly reduced, because the switching device of the apparatus can provide serial switching arrangement for selection of each of the test points. In addition, the apparatus of the invention provides a straight-forward means for giving the user an immediate visual indication of the test result.

The present invention will now be described by way of example with reference to particular embodiments illustrated in the accompanying drawings. It should be understood, however, that the following description of preferred embodiments is not intended to limit the generality of the inventive concept as described above or as defined in the appended claims.

BRIEF DESCRIPTION OF THE DRAWINGS

Preferred embodiments of the invention are hereafter described with reference to the accompanying drawing figures, in which like reference characters designate like features, and in which:

FIG. 2 is a schematic front perspective view of a test apparatus according one embodiment of the present invention;

FIG. 3 is a schematic rear perspective view of the test apparatus shown in FIG. 2.

DETAILED DESCRIPTION OF THE PREFERRED EMBODIMENTS

Figure 1:
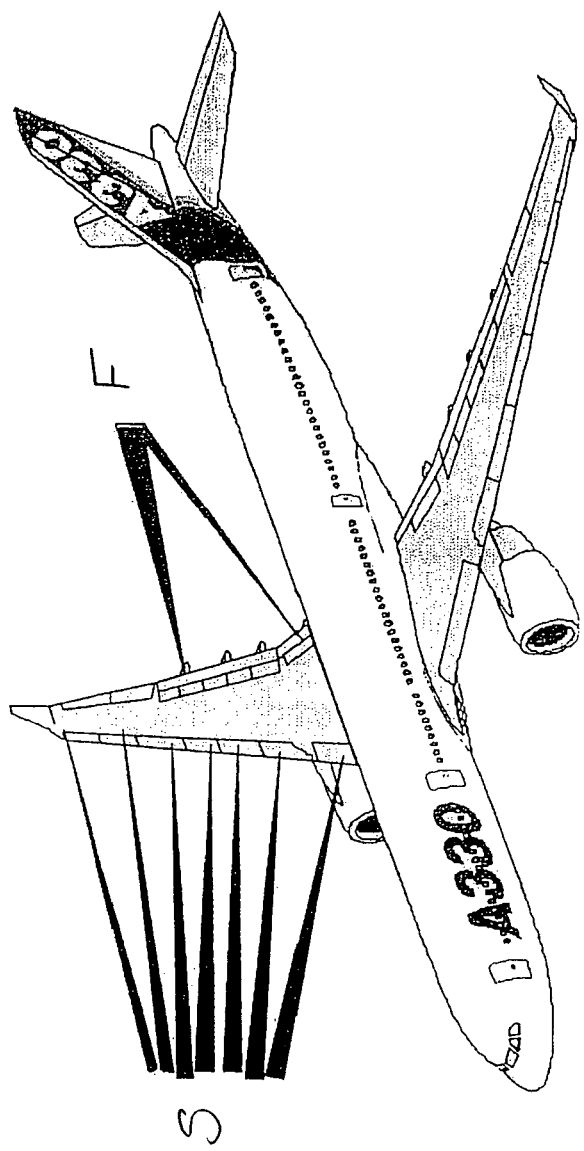
FIG. 1 is a schematic perspective view of a commercial aircraft illustrating the locations of the wing flaps and wing slats.

A preferred embodiment of the present invention is designed for testing a control system for controlling the operation of aircraft wing flaps and wing slats. With reference to FIG. 1 of the drawings, the flaps F of an aircraft are hinged surfaces mounted at the rear or trailing edge of each wing towards the body of the aircraft. The flaps F are able to be deflected downwards to increase the wing curvature and thereby generate additional lift for low speed, high angle of attack flight, which is typical during landing. Similarly, the slats S of the aircraft are small aerodynamic surface extensions mounted on the front or leading edge of each wing, which are extendable to generate additional lift and allow the wing to operate at higher angles of attack. The slats S are typically deployed during take-off and landing but are usually retracted during cruising flight.

The control of the flaps F and slats S of an aircraft typically occurs having regard to signals output by a Feedback Position Pickoff Unit (FPPU) and an Asymmetry Position Pickoff Unit (APPU). The signals of the FPPU provide information about the position of the flaps and slats and the signals of the APPU provide information about asymmetries between the starboard or right-hand (RH) wing and the port or left-hand (LH) wing. A control processor is employed to read out the signals of the FPPU and the APPU. In the course of ground tests of the aircraft, e.g. during assembly or commissioning, it is necessary to test the FPPU-inputs and the APPU-inputs of the control processor. In particular, it is necessary to check whether a particular voltage exists at these inputs, which corresponds to an actual flap/slat angle or position. This particular or defined voltage is read out by an angle measuring device.

To this end, the present invention provides a test apparatus 1 and a corresponding test method as will now be described with reference to the drawing FIGS. 2 to 4. In particular, the FPPU-inputs and the APPU-inputs of a control processor are arranged and consolidated for plug-in type coupling to a connector unit 10 of the test apparatus 1. The connector unit 10 comprises a portable casing 11 having a handle 12 on its rear side for ease of carrying. On its front side, the casing 11 of the connector unit 10 presents a number of connection elements 13 in the form of plug-in type sockets for coupling to the FPPU-input points and the APPU-input points of the control processor.

Furthermore, the test apparatus 1 comprises a hand-held selector unit 20 for individually selecting any particular one of the FPPU-input points and the APPU-input points of interest to be tested. In this regard, it is to be noted that the control processor of the aircraft flap-slat control system has (i) an FPPU-input point, a RH APPU-input point and a LH APPU-input point for the flaps F, and (ii) an FPPU-input point, a RH APPU-input point and a LH APPU-input point for the slats S. Accordingly, at a front face 21 of the selector unit 20, a rotatable dial-type switching device 22 is provided with discrete switch positions 24. The switch positions are labeled to show how the dial 22 should be rotated to select the processor input points for control of the slats S on the "SLAT" side of the front face 21, and the processor input points for control of the flaps F on the "FLAP" side of the front face. When the dial is rotated to select a particular FPPU- or APPU-input (i.e. test point) of the control processor, an electrical connection between the apparatus 1 and the selected test point of the processor is enabled.

The selector unit 20 is operatively connected to the rear side 14 of the connector unit 10 via a cable 15, which may be provided in any suitable length. As can be seen in FIG. 2 of the drawings, the front face 21 of the selector unit 20 includes an indicator device or display 25 showing the word "OFF". When the defined voltage (which corresponds to the flap/slat position) is detected at the selected input point (i.e. test point) of the control processor, this indicator device 25 may be designed to display an appropriate word, such as "ACTIVE", or alternatively to simply illuminate.

Figure 4:
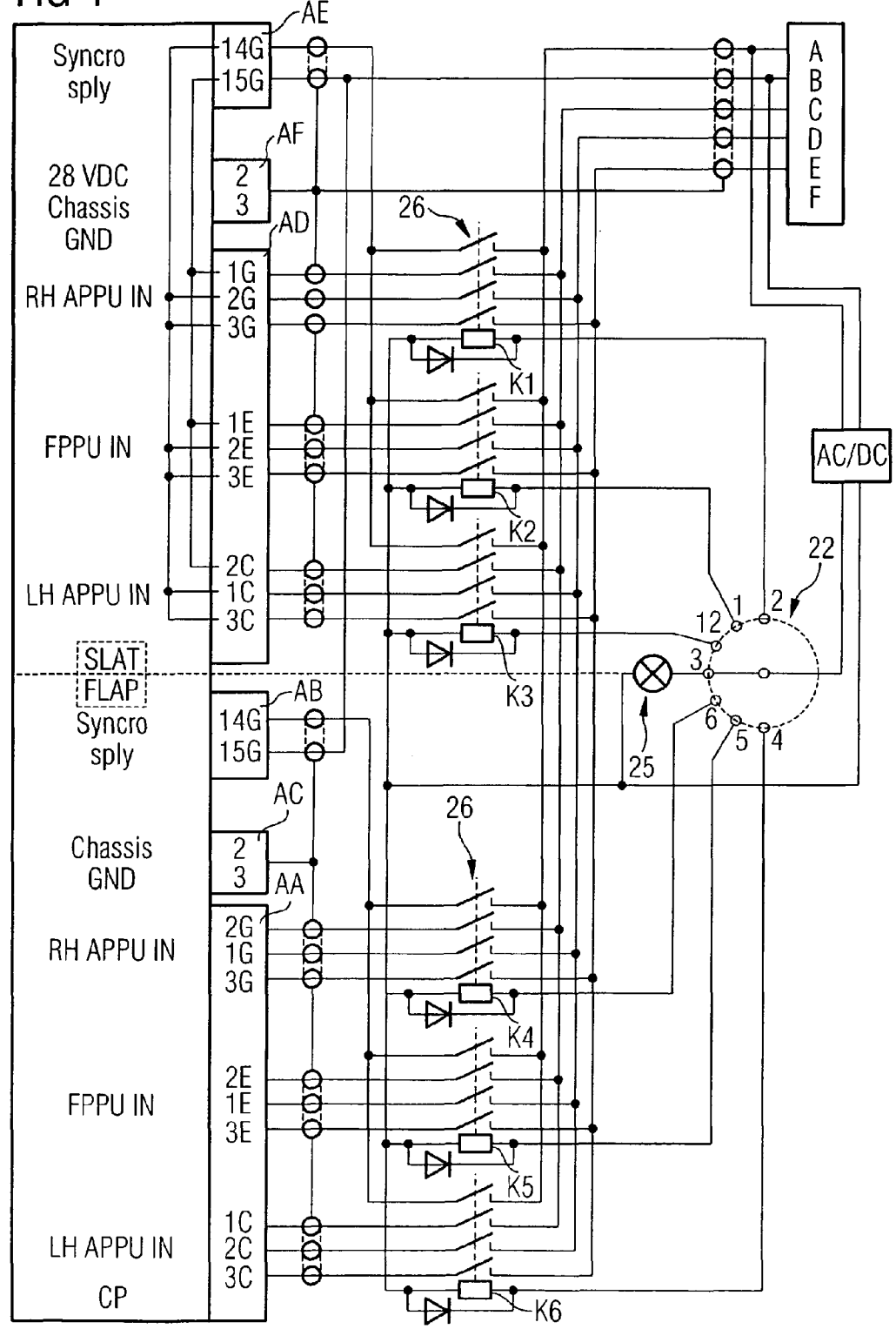
FIG. 4 is a circuit diagram for the test apparatus shown in FIGS. 2 and 3.

As can be seen in the circuit diagram shown in FIG. 4, the apparatus 1 includes sets of relay switches 26 for enabling a connection to each of the multi-circuit inputs of the processor CP. The circuit diagram in FIG. 4 illustrates the indicator device 25 as comprising a lamp or light-emitting diode (LED), which is designed to illuminate when a defined voltage is detected at the selected test point. In this way, the lamp or LED 25 serves as a detector for detecting whether or not a defined voltage exists at the selected test point, and simultaneously as an indicator of the test result to the user of the apparatus. Thus, when a user operates the selector unit 20 to select the individual test points of the processor by rotating the dial-type switch 22, the user receives an immediate indication from the LED or the display 25 as to whether or not the test point is in a satisfactory state.

Advantageously, the method and the apparatus 1 of the invention only involves a single connection operation to the processor, and the various inputs of the processor for control of both the flaps F and slats S can be checked in series in a simple and efficient manner by rotating the switching device 22 and observing the indicator device 25.

It will be appreciated that various alterations and/or additions may be made to the features of particular embodiment of the method and apparatus of the invention described above with reference to the drawings without departing from the scope of the invention as defined in the appended claims.

In this regard, another embodiment of the invention that is not specifically illustrated in the drawings concerns an application of the apparatus and method to the testing of an aircraft fire safety system. In particular, an aircraft fire safety system typically includes a number of fire detection circuits or "loops" which, in the event of a fire, are designed to generate an electrical signal that may effect a warning signal in the cockpit and/or may activate a fire-extinguishing system. The fire detection loops typically comprise wax-coated cables. Under the elevated temperatures caused by a fire (and set at a predetermined threshold), the wax coating melts such that the cables come into contact with the outer shell of the aircraft and this, in turn, results in the generation of the electrical signal.

In the course of ground tests, it is necessary to check whether the fire detection loops of an aircraft fire safety system are properly connected to form closed circuits and do not have any breakages or discontinuities resulting from cable damage. Thus, an apparatus and method embodying the central concepts of the invention could be employed to test the continuity of each of the fire detection loops, selectively and serially, one after the other. In this regard, an apparatus according to the invention could be coupled to a unit for receiving the signals of the fire detection loops, such that the output of each of the fire detection loops to that signal receiving unit forms a separate test point. The outputs of each circuit could then be individually selected and tested using the apparatus and method of the invention to check the integrity of each loop.

A further embodiment of the invention not illustrated in the drawings concerns an application of the apparatus and method of the invention to the selective testing of the individual channels of an aircraft communication system. Again, the channels of the communication system should form complete circuits, such that the integrity of each channel could be evaluated in similar fashion.

The invention claimed is:

1. A method of testing an aircraft control system, comprising the steps of:
    coupling a plurality of connection elements of a portable connector unit of an apparatus for testing an aircraft control system to a plurality of separate input points in the aircraft control system to be tested;
    operatively connecting a hand-held selector unit to the connector unit via a cable, wherein the hand-held selector unit comprises a series switching device, and a detector and indicator device;
    serially selecting individual ones of each of the plurality of separate input points in the aircraft control system to be tested by actuation of the series switching device of the hand-held selector unit to provide an electrical connection between the selected one of the plurality of separate input points in the aircraft control system to be tested and the hand-held selector unit, wherein all of the plurality of separate input points in the aircraft control system to be tested are individually tested one after the other in a series; and
    detecting and indicating whether a defined voltage exists at the selected one of the plurality of separate input points in the aircraft control system to be tested using the detector and indicator device of the hand-held selector unit.

2. A method according to claim 1, further comprising the step of:
    generating one or more test signal(s) as an input to the selected one of the plurality of separate input points in the aircraft control system to be tested.

3. An apparatus for testing an aircraft control system, the apparatus comprising:
- a portable connector unit provided with a plurality of connection elements for simultaneously coupling the portable connector unit to a plurality of separate input points in the aircraft control system to be tested; and
- a hand-held selector unit having a series switching device and a detector and indicator device, wherein the hand-held selector unit is operatively connected to the connector unit via a cable, and the series switching device is configured to serially select individual ones of each of the plurality of separate input points in the aircraft control system to be tested in a series to provide an electrical connection between the selected one of the plurality of separate input points in the aircraft control system to be tested and the hand-held selector unit, and wherein the detector and indicator device is configured to provide a signal when a defined voltage exists at the selected one of the plurality of separate input points in the aircraft control system to be tested.

4. An apparatus according to claim 3, wherein the series switching device includes a rotatable dial and/or a push-button type switching arrangement.

5. An apparatus according claim 3, comprising signal means for generating one or more test signal(s) as an input to the selected one of the plurality of separate input points in the aircraft control system to be tested.

* * * * *